United States Patent
Cook et al.

(10) Patent No.: US 10,622,270 B2
(45) Date of Patent: Apr. 14, 2020

(54) INTEGRATED CIRCUIT PACKAGE WITH STRESS DIRECTING MATERIAL

(71) Applicant: Texas Instruments Incorporated, Dallas, TX (US)

(72) Inventors: Benjamin Stassen Cook, Addison, TX (US); Daniel Lee Revier, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/693,368

(22) Filed: Aug. 31, 2017

(65) Prior Publication Data

US 2019/0067139 A1    Feb. 28, 2019

(51) Int. Cl.
*H01L 23/29* (2006.01)
*H01L 23/495* (2006.01)
(Continued)

(52) U.S. Cl.
CPC .......... *H01L 23/295* (2013.01); *H01L 21/563* (2013.01); *H01L 23/3135* (2013.01);
(Continued)

(58) Field of Classification Search
CPC ... H01L 23/295; H01L 23/29; H01L 23/3135; H01L 23/495; H01L 23/49568; H01L 23/3107; H01L 23/49541; H01L 23/562; H01L 23/31; H01L 23/315; H01L 23/66; H01L 23/498; H01L 23/3121; H01L 23/49538; H01L 21/00; H01L 21/56; H01L 21/563; H01L 21/78; H01L 21/781; H01L 21/782; H01L 21/683; H01L 21/6836; H01L 21/44; H01L 27/322; H01L 27/3244; H01L 27/32; H01L 2224/32245; H01L 2224/48091; H01L 2224/73265; H01L 2224/92247; H01L 2224/97; H01L 2224/181
(Continued)

(56) References Cited

U.S. PATENT DOCUMENTS 3,868,759 A    3/1975   Hartleroad et al.
3,868,764 A    3/1975   Hartleroad et al.
(Continued)

FOREIGN PATENT DOCUMENTS

| RU | 1780469 A1 | 10/1995 |
|---|---|---|
| WO | 2006101577 A2 | 9/2006 |
| WO | 2017111892 | 6/2017 |

OTHER PUBLICATIONS

Optical Sensor-On-Chip ICs Simplify Handheld Spectrometer Design, available at https://www.digikey.com/en/articles/techzone/2017/jun/optical-sensor-on-chip-ics-simplify-handheld-spectrometer-design, Digi-Key Electronics, Jun. 28, 2017, pp. 1-6.
(Continued)

*Primary Examiner* — Chuong A Luu
(74) *Attorney, Agent, or Firm* — Michael A. Davis, Jr.; Charles A. Brill; Frank D. Cimino (57) ABSTRACT

An encapsulated integrated circuit that includes an integrated circuit (IC) die and an encapsulation material encapsulating the IC die. A first portion of the encapsulation material is solid and a second portion of the encapsulation material includes spaces filled with a second material.

16 Claims, 10 Drawing Sheets

(51) Int. Cl.
*H01L 21/56* (2006.01)
*H01L 23/31* (2006.01)
*H01L 23/00* (2006.01)

(52) U.S. Cl.
CPC .... *H01L 23/49568* (2013.01); *H01L 23/3107* (2013.01); *H01L 23/49541* (2013.01); *H01L 23/562* (2013.01); *H01L 2224/32245* (2013.01); *H01L 2224/48091* (2013.01); *H01L 2224/73265* (2013.01); *H01L 2224/92247* (2013.01); *H01L 2224/97* (2013.01); *H01L 2924/181* (2013.01)

(58) Field of Classification Search
USPC .......................................................... 257/789
See application file for complete search history.

(56) References Cited

U.S. PATENT DOCUMENTS

| | | | |
|---|---|---|---|
| 4,974,590 A | 12/1990 | Saito | |
| 4,999,587 A | 3/1991 | Evans | |
| 5,355,577 A | 10/1994 | Cohn | |
| 5,500,912 A | 3/1996 | Alonas et al. | |
| 5,528,074 A | 6/1996 | Goto et al. | |
| 5,834,320 A | 11/1998 | Huddleston et al. | |
| 6,664,615 B1 | 12/2003 | Bayan et al. | |
| 6,967,347 B2 | 11/2005 | Estes et al. | |
| 6,979,105 B2 | 12/2005 | Leysath | |
| 7,228,016 B2 | 6/2007 | Beausoleil | |
| 7,305,161 B2 | 12/2007 | Zhou | |
| 7,733,198 B1 | 6/2010 | Olsson et al. | |
| 8,031,012 B2 | 10/2011 | Hasegawa | |
| 8,054,145 B2 | 11/2011 | Mohammadi et al. | |
| 8,094,023 B1 | 1/2012 | El-Kady et al. | |
| 8,138,868 B2 | 3/2012 | Arnold | |
| 8,143,637 B2 | 3/2012 | Kanatake | |
| 8,587,182 B2 | 11/2013 | Reiche | |
| 9,018,074 B2 | 4/2015 | Zhang et al. | |
| 9,070,703 B2 | 6/2015 | Haroun et al. | |
| 9,123,737 B2 | 9/2015 | Haroun et al. | |
| 9,306,263 B2 | 4/2016 | Herbsommer et al. | |
| 9,343,426 B1 | 5/2016 | Parvarandeh | |
| 9,373,878 B2 | 6/2016 | Schuppener et al. | |
| 9,450,563 B2 | 8/2016 | Gorisse et al. | |
| 9,583,811 B2 | 2/2017 | Seler et al. | |
| 9,647,329 B2 | 5/2017 | Herbsommer et al. | |
| 9,651,718 B2 | 5/2017 | Chen et al. | |
| 10,062,583 B2 | 8/2018 | Costa et al. | |
| 10,139,564 B1 | 11/2018 | Homeijer et al. | |
| 2005/0224956 A1 | 10/2005 | Kao et al. | |
| 2006/0038168 A1 | 2/2006 | Estes et al. | |
| 2006/0054780 A1 | 3/2006 | Garrood et al. | |
| 2007/0108545 A1 | 5/2007 | Chua et al. | |
| 2008/0112665 A1 | 5/2008 | Beausoleil et al. | |
| 2008/0218299 A1 | 9/2008 | Arnold | |
| 2009/0288852 A1* | 11/2009 | Hirokawa | H01L 23/055 174/50.52 |
| 2010/0019247 A1* | 1/2010 | Joichi | H01L 33/32 257/76 |
| 2011/0001233 A1* | 1/2011 | Iwase | H01L 21/563 257/737 |
| 2011/0089815 A1 | 4/2011 | Yeh et al. | |
| 2011/0103632 A1 | 5/2011 | Leclair et al. | |
| 2011/0133597 A1 | 6/2011 | Pavlov et al. | |
| 2011/0221057 A1 | 9/2011 | Lin et al. | |
| 2012/0043628 A1 | 2/2012 | Martin et al. | |
| 2012/0098611 A1 | 4/2012 | Sinha et al. | |
| 2012/0154168 A1 | 6/2012 | Duncan et al. | |
| 2013/0038174 A1 | 2/2013 | Kim et al. | |
| 2013/0228796 A1 | 9/2013 | Mieczkowski | |
| 2014/0287703 A1 | 9/2014 | Herbsommer et al. | |
| 2014/0326902 A1 | 11/2014 | Tahan et al. | |
| 2015/0237423 A1 | 8/2015 | Bahr et al. | |
| 2015/0295305 A1 | 10/2015 | Herbsommer et al. | |
| 2016/0028367 A1 | 1/2016 | Shealy | |
| 2016/0276311 A1 | 9/2016 | Meyer et al. | |
| 2016/0327977 A1 | 11/2016 | Tang et al. | |
| 2017/0084519 A1 | 3/2017 | Speight et al. | |
| 2017/0108655 A1 | 4/2017 | Zarbock et al. | |
| 2017/0186793 A1 | 6/2017 | Ockenfuss | |
| 2017/0253476 A1 | 9/2017 | Shibuya et al. | |
| 2017/0276870 A1 | 9/2017 | Snyman | |
| 2017/0288123 A1* | 10/2017 | Hatano | H03H 3/08 |
| 2017/0292884 A1 | 10/2017 | Ching, Jr. et al. | |
| 2017/0323804 A1* | 11/2017 | Costa | H01L 23/645 |

OTHER PUBLICATIONS

Hideo Kosaka et al, "Self-Collimating Phenomena in Photonic Crystals", Applied Physics Letters, vol. 74, No. 9, Mar. 1, 1999, pp. 1212-1214.

Phonon, Wikipedia, available at https://en.wikipedia.org/wiki/Phonon on Aug. 2, 2017, pp. 1-9.

Yan Pennec and Bahram Djafari-Rouhani, "Fundamental Properties of Phononic Crystal", Chapter 2 in "Phononic Crystals", 2016, pp. 23-50.

Daniel Frederic Sievenpiper, "High-Impedance Electromagnetic Surfaces", 1999, University of California, pp. 1-162.

Nagi Elabbasi, "Modeling Phononic Band Gap Materials and Structures", Comsol Blog, Feb. 10, 2016, pp. 1-7.

Dr. Qin Hu, "Multiphoton Lithograpy Based 3D Micro/Nano Printing", EPSRC Centre for Innovative Manufacturing in Additive Manufacturing, pp. 1-30.

"Standard Terminology for Additive Manufacturing Technologies", ASTM International, F2792-12a,Sep. 9, 2013, pp. 1-3.

"7 Families of Additive Manufacturing", According to ASTM F2792 Standards, Hybrid Manufacturing Technologies, pp. 1-2.

International Search Report for PCT/US2018/058478 dated Feb. 14, 2019.

Mohammadi, et al. Complete phononic bandgaps and bandgap maps in two-dimensional silicon phononic crystal plates; Electronics Letters Aug. 2, 2017, vol. 43 No. 16. 2 pages.

International Search Report for PCT/US2018/058481 dated Feb. 7, 2019.

International Search Report for PCT/US2018/058487 dated Feb. 7, 2019.

International Search Report for PCT/US2018/057358 dated Feb. 7, 2019.

International Search Report for PCT/US2018/057351 dated Feb. 7, 2019.

International Search Report for PCT/US2018/049166 dated Dec. 13, 2018.

International Search Report for PCT/US2018/049135 dated Dec. 13, 2018.

International Search Report for PCT/US2018/058494 dated Feb. 21, 2019.

\* cited by examiner

INTEGRATED CIRCUIT PACKAGE WITH STRESS DIRECTING MATERIAL

FIELD OF THE DISCLOSURE

This disclosure relates to an integrated circuit package that includes stress directing material in the package.

BACKGROUND OF THE DISCLOSURE

Individual discrete components are typically fabricated on a silicon wafer before being cut into separate semiconductor die and assembled in a package. The package provides protection against impact and corrosion, holds the contact pins or leads which are used to connect from external circuits to the device, and dissipates heat produced in the device.

Wire bonds may be used to make connections between an integrated circuit and the leads of the package with fine wires connected from the package leads and bonded to conductive pads on the semiconductor die. The leads external to the package may be soldered to a printed circuit board. Modern surface mount devices eliminate the need for drilled holes through circuit boards and have short metal leads or pads on the package that can be secured by reflow soldering.

Many devices are molded out of an epoxy plastic that provides adequate protection of the semiconductor devices and mechanical strength to support the leads and handling of the package. Lead materials should be chosen with a thermal coefficient of expansion to match the package material.

Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board.

BRIEF DESCRIPTION OF THE DRAWINGS

Particular embodiments in accordance with the disclosure will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

The epoxy encapsulant for semiconductor chips/packages has typically served the primary purpose of providing environmental and mechanical protection for the integrated circuit (IC). Previously, in order for an additional package function to be added, it must be added before or after the encapsulation step. Performing additional packaging steps may increase cost and limit functionality on the processes that can be performed. A method for encapsulating an IC will now be disclosed in which a structure to perform an additional package function may be created during the process of encapsulation.

Dissimilar materials within an encapsulated package may expand and respond to thermally induced and/or mechanically induced stress differently. For example, silica particles contained within the encapsulant material may press down on sensitive areas of the die and may thereby cause detuning of capacitors that are fabricated on the semiconductor die, for example. Mechanical or thermally induced stress on the die produced by the encapsulant material may occur both above and below the die internal to the encapsulated package.

In some applications, such stress on the die may cause detuning of sensitive circuits and should be minimized. Alternatively, in some application this stress caused detuning may be used as a low-cost motion sensor, acoustic sensor, or pressure transducer, for example, in which case the stress may need to be amplified towards a sensitive area of the die.

Traditional encapsulation processes do not allow formation of a stress directing structure within the encapsulant material. However, additive manufacturing processes have enabled the deposition of patterned materials in a rapid and cost efficient manner. By utilizing additive manufacturing, various mechanical/acoustic functions may be easily integrated directly into the encapsulation material of an IC package. Embodiments of a packaged integrated circuit within a stress filter package implemented with spatially varying encapsulation materials within a multi-material encapsulated IC package will be described in more detail herein.

The structures described herein may provide mechanical isolation of the IC die from thermal and mechanical stress produced by the package lead frame and/or the encapsulant. In another embodiment, the structures described herein may allow thermal or mechanical stress from the lead frame and/or package encapsulant to be focused on a particular region of the semiconductor die. In another embodiment, the structures described herein may allow heat sink capacity to be directed to a particular region of the semiconductor die.

Figure 1:
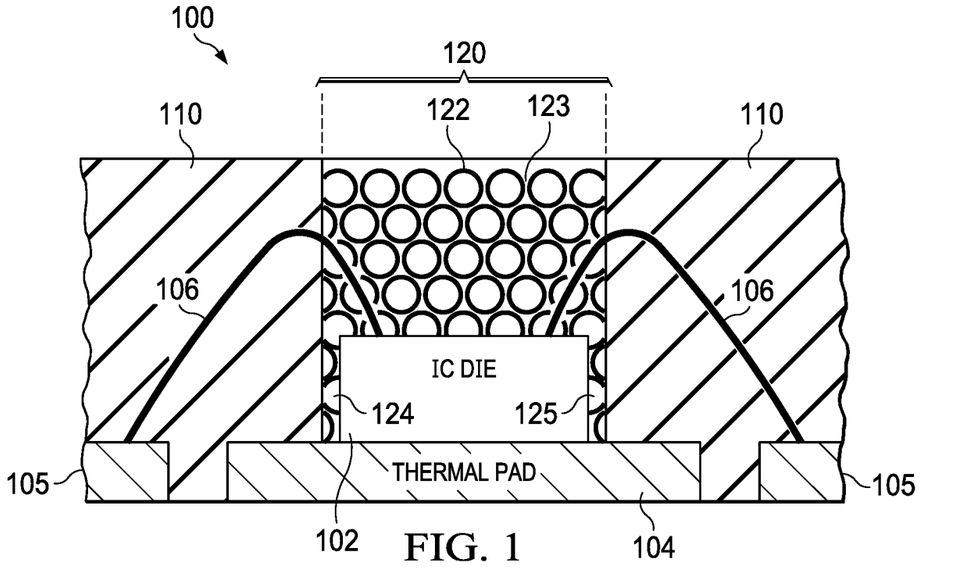
FIGS. 1-4 are cross sectional views of examples of encapsulated integrated circuits (IC) that include stress directing structures within the encapsulant material.

FIG. 1 is a cross sectional view of an example encapsulated integrated circuit (IC) package 100 that includes a stress directing structure 120 within the encapsulant material 110. IC die 102 may be attached to a thermal pad 104 of a leadframe that includes a set of contacts 105. IC die 102 may be fabricated using known or later developed semiconductor processing techniques. IC die 102 may include an epitaxial (epi) layer on the top surface in which are formed various semiconductor transistor devices and interconnects. One or more conductive layers may be formed on the epi layer and patterned into interconnect traces and bond pads. A set of bond wires 106 may be attached to contacts 105 and bond pads located on the surface of IC die 106 using known or later developed wire bonding techniques. In this example, IC package 100 is a quad-flat no-leads (QFN) package; however, in other embodiments various known or later developed packaging configurations, such as DFN, MLF, SON, dual inline packages (DIP), etc., may be fabricated using the techniques disclosed herein to form an encapsulated package with stress directing material included with the encapsulant material.

In this example, a solid encapsulant material 110 surrounds and encapsulates IC die 102. A portion of the encapsulation material indicated in general at 120 may include spaces such as indicated at 122 that may be filled with a material that is different from encapsulation material 110. In this example, spaces 122 are arranged in a three dimensional array of spherical spaces that are in turn separated by a lattice of encapsulation material 123. Encapsulation material 123 may be the same or different as solid encapsulation material 110. The structure formed by the array of spaces 122 and lattice 123 will be referred to herein as a "stress directing material."

In this example, a portion of stress directing material 120 is also placed on the sides of IC die 102, as indicated at 124, 125. In this cross sectional view of IC package 100, two sides of IC die 102 are visible. It is to be understood that IC die 102 typically has four sides and each side may be either in direct contact with a solid portion of encapsulation material 110 or in contact with stress directing material 120 as illustrated at 124, 125.

Additive manufacturing processes are now being used in a number of areas. the International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. An example process for forming IC package 100 will be described in more detail below with regard to FIGS. 6A-6C.

Solid encapsulant material 110 is typically an epoxy based material that provides mechanical protection and seals IC die 102 from environmental gases and liquids.

In this example, lattice 123 may be in contact at various places across the entire upper surface of IC die 102. As mentioned above, lattice 123 may be formed from the same material as solid encapsulation material 110, or it may be formed using a different material by using an additive manufacturing process. The array of spaces 122 may be formed with one or more different materials. For example, some of the spaces may be filled with a first material and some of them may be filled with different types of material. There may be a number (N) of different materials that are used to fill N different regions of encapsulation material 120. Material 122 may be a polymer or other material that has different intrinsic material properties from the solid encapsulant 110.

For example, material 122 may be air or some other gas is some embodiments. In another embodiment, material 122 may be a vacuum. In other embodiments, material 122 may be soft or rubbery to minimize stress on IC die 102. In another embodiment, certain spaces 122 may be filled with a hard material in order to exert stress on a particular circuit node on the top surface of IC 102, while other spaces 122 are filled with a soft material to minimize stress on other regions of IC 102.

In the example of FIG. 1, lattice 123 forms an array of spherical bubbles. In other embodiments, a differently shaped lattice may be formed to produce other shapes of spaces, such as: triangular, square, hexagonal, round bubbles, elongated bubbles, tubes, etc.

Figure 2:
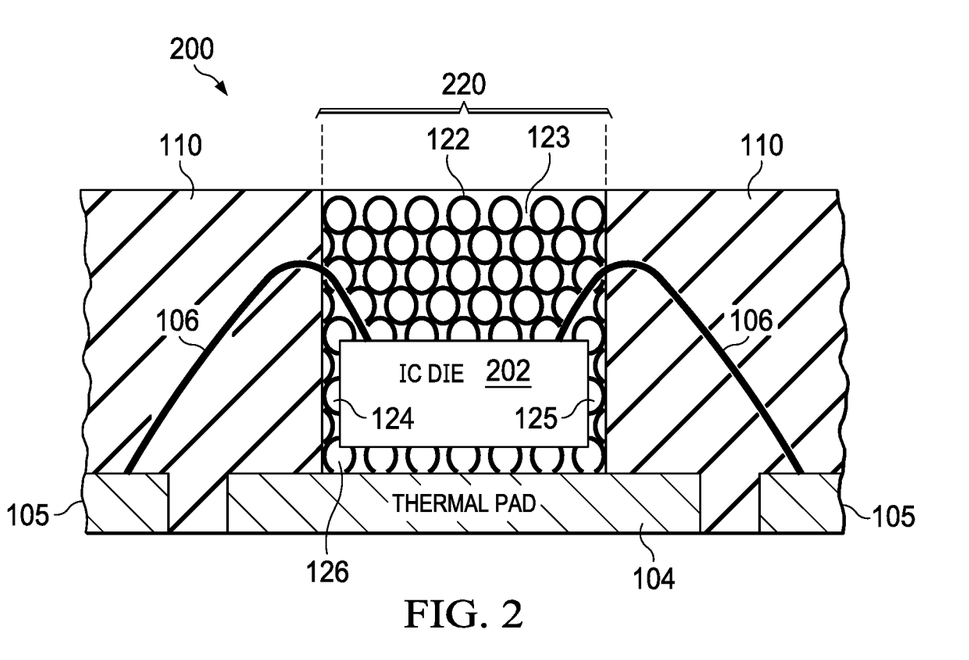

FIG. 2 is a cross sectional view of an example encapsulated IC package 200 that includes a stress directing structure 220 within the encapsulant material 110. This example may be similar to the example of FIG. 1, except that additional stress directing material 126 may be placed between thermal pad 104 and the bottom of IC 202. In this example, certain spaces within the layer of stress directing material may be filled with a material the easily conducts heat from IC 202 to thermal pad 104 while other spaces within stress directing material 126 may be filled with thermal insulating material.

Figure 3:
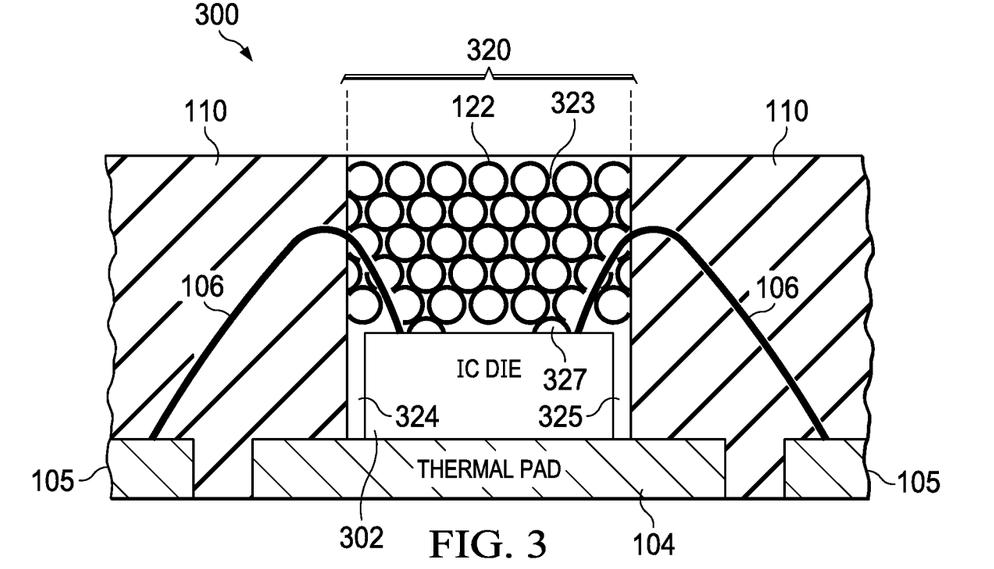

This configuration may be useful in a "flip chip" configuration in which the IC die is mounted upside down and it is desirable to isolate some regions of the active circuitry in the epi layer from the heat being conducted into the thermal pad, for example FIG. 3 is a cross sectional view of an example encapsulated IC package 300 that includes a stress directing structure 320 within the encapsulant material 110. This example may be similar to the example of FIG. 1, except that the lattice 323 may be configured to contact IC 302 in only a few locations, such as indicated at 327. In this example, the sides of IC 302 may be separated from solid encapsulant 110 as indicated at 324, 325. In another embodiment, the sides of IC 302 may be in contact with solid encapsulant 110, for example.

In this example, several instances of lower lattice portion 327 may be required to allow upper lattice portion 323 to be formed if the space between upper lattice 323 and IC 302 is filled with air or another gas. However, if a solid fill material is used to fill the space between IC 102 and upper lattice 323, then only a few instances of lower lattice 327 may be required since the solid fill material could support the upper lattice while it is being fabricated. In some embodiments, upper lattice 323 may be entirely separate from IC 302, supported by a layer of elastic material adjacent IC 302, for example.

Figure 4:
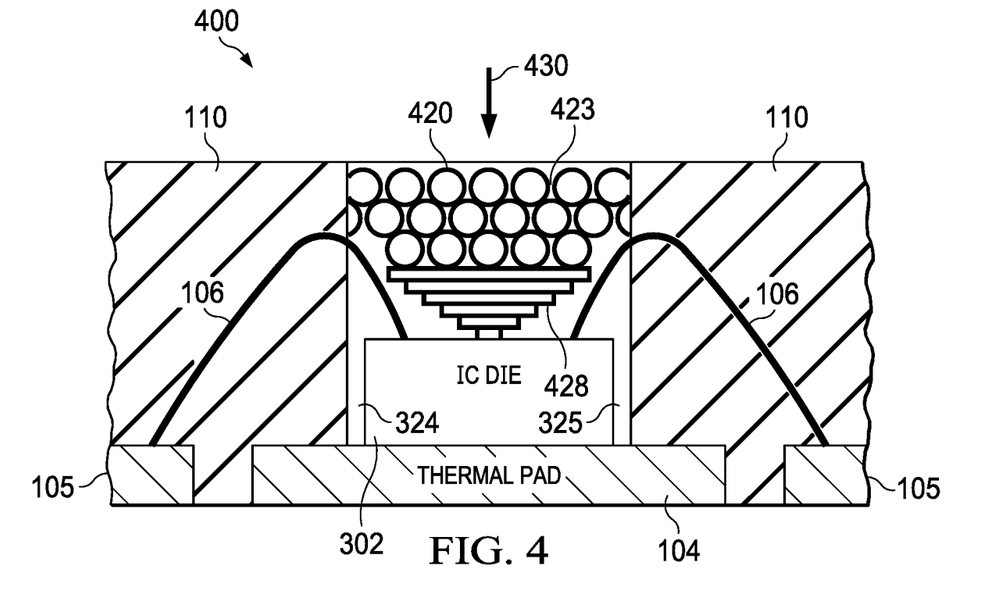

FIG. 4 is a cross sectional view of an example encapsulated IC package 400 that includes a stress directing structure 420 within the encapsulant material 110. This example may be similar to the example of FIG. 1, except that the lattice 423 may be configured to contact IC 402 in only a single location, such as indicated at 328. In this example, the sides of IC 402 may be separated from solid encapsulant 110 as indicated at 324, 325. In another embodiment, the sides of IC 402 may be in contact with solid encapsulant 110, for example.

In this example, stress directing structure 420 is configured to transfer an external force 430 to a point 428 on IC 402, such as a capacitor whose capacitive value may be affected by the amount of force transferred to point 428 from external force 430. The external force may be a mechanically induced force, for example. In another application, the force may be due to an ambient gas pressure, for example. In this manner, IC 402 may operate as a pressure transducer.

Figure 5:
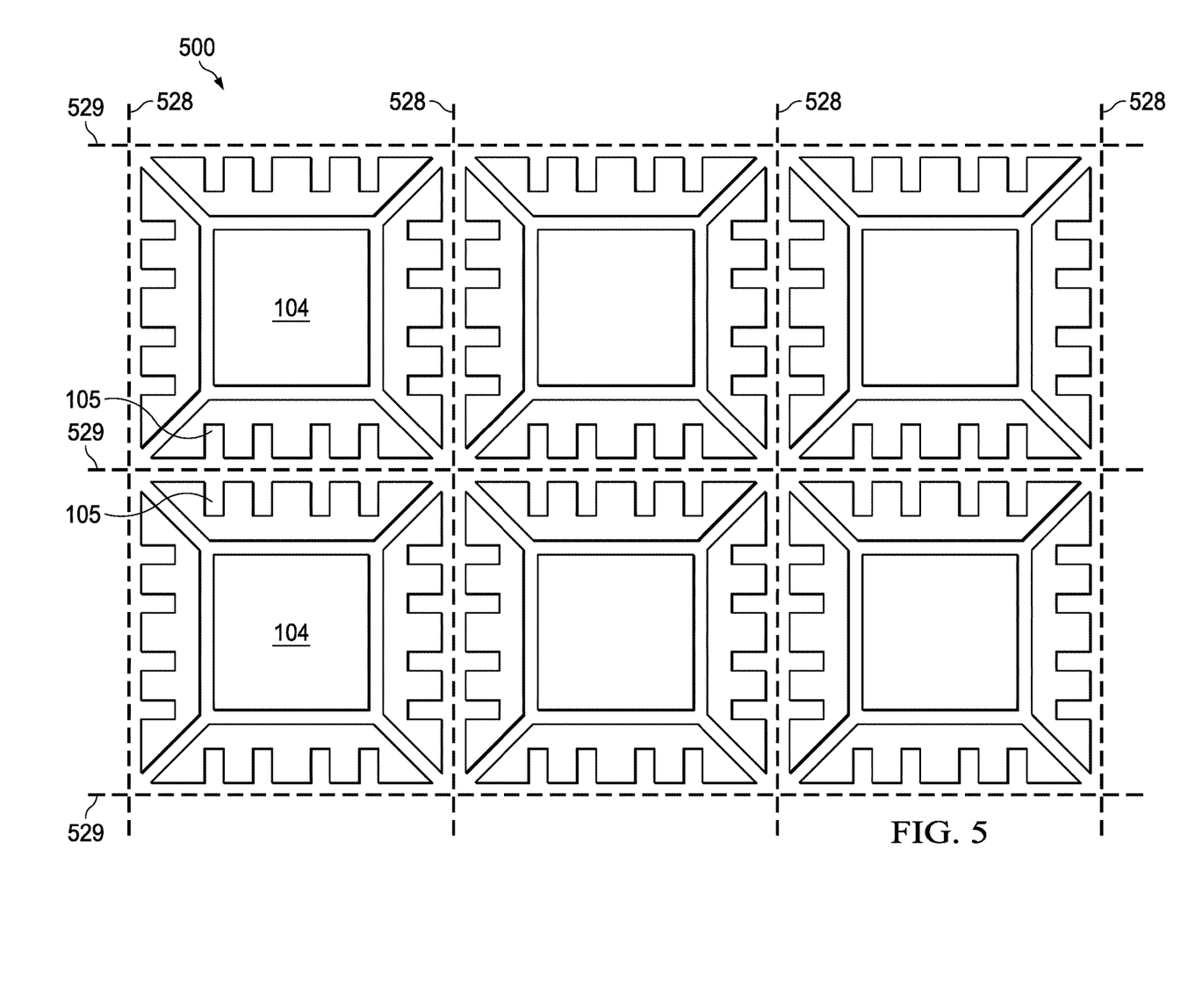
FIG. 5 is a top view of a portion of an example lead frame.

FIG. 5 is a top view of an example lead frame strip 500 that may be used to support QFN IC 100 in FIG. 1, for example. Lead frame strip 500 may include one or more arrays of individual lead frames. Lead frame strip 500 is typically fabricated from a copper sheet that is etched or stamped to form a pattern of thermal pads and contacts. Lead frame strip 500 may be plated with tin or another metal that will prevent oxidation of the copper and provide a lower contact surface that is easy to solder. An IC die may be attached to each individual lead frame.

Each individual leadframe may include a thermal pad, such as thermal pads 104. Each individual lead frame also includes a set of contacts that surround the thermal pad, such as contacts 105. A sacrificial strip of metal connects all of the contacts together and provides mechanical support until a sawing process removes it. An IC die, also referred to as a "chip," is attached to each thermal pad during a packaging process. Wire bonding may then be performed to connect bond pads on each IC chip to respective contacts on the lead frame. The entire lead frame strip 500 may then be covered with a layer of mold compound using an additive process as described in more detail below to encapsulate the ICs. Lead frame strip 500 may then be singulated into individual packaged ICs by cutting along cut lines 528, 529.

Figure 6A:
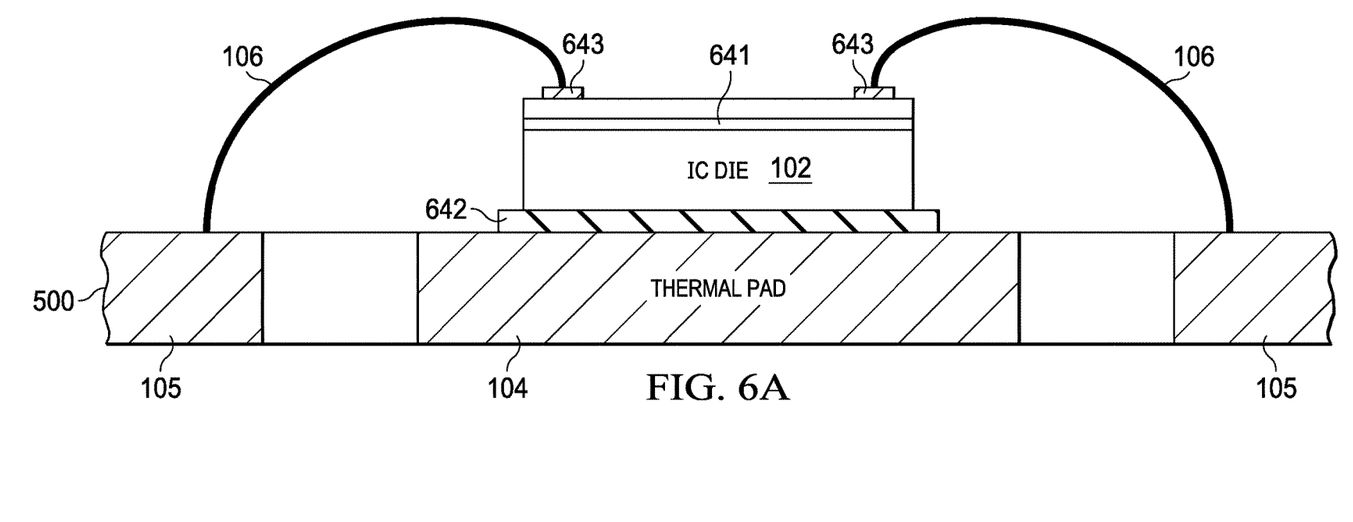
FIGS. 6A-6C, 7A-7C, and 8A-8C are cross sectional views illustrating fabrication of some of the example IC packages of FIGS. 1-4.
Figure 6B:
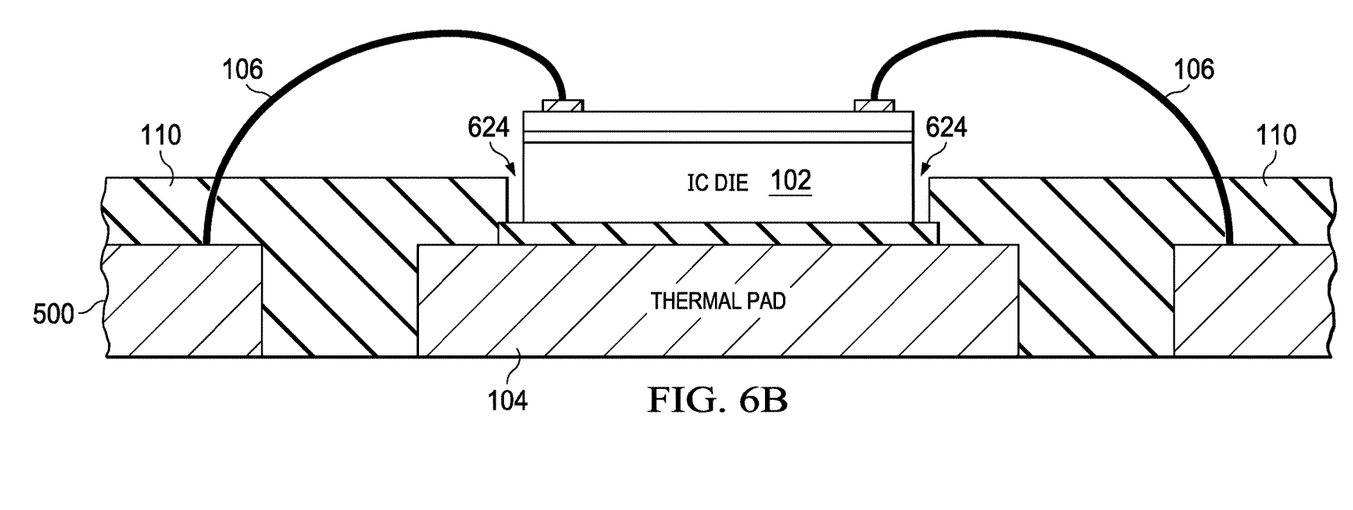
Figure 6C:
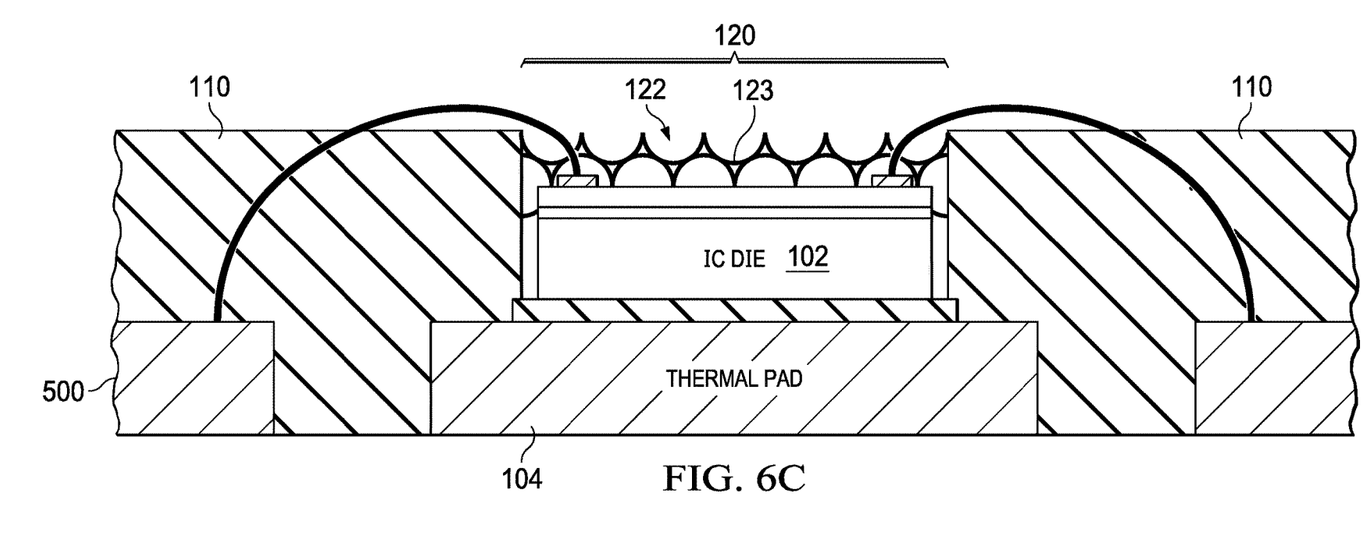

FIGS. 6A-6C are cross sectional views illustrating fabrication of the example IC package 100 of FIG. 1. IC die 102 may be attached by die attach layer 642 to a thermal pad 104 of a leadframe that may be part of a leadframe strip similar to leadframe strip 500 shown in FIG. 5 that includes a set of contacts 105. IC die 102 may be fabricated using known or later developed semiconductor processing techniques. IC die 102 may include an epitaxial (epi) layer 641 on the top surface in which are formed various semiconductor transistor devices and interconnects. One or more conductive layers may be formed on the epi layer and patterned into interconnect traces and bond pads 643. A set of bond wires 106 may be attached to contacts 105 and bond pads 643 located on the surface of IC die 106 using known or later developed wire bonding techniques. In this example, IC package 100 is a quad-flat no-leads (QFN) package; however, in other embodiments various known or later developed packaging configurations, such as DFN, MLF, SON, dual inline packages (DIP), etc., may be fabricated using the techniques disclosed herein to form an encapsulated package with stress directing material included with the encapsulant material.

FIG. 6B is a cross sectional view illustrating partial formation of encapsulation material 110. In this example, a vat photopolymerization process may be used in which leadframe strip and the ICs attached to it, such as IC die 102, are lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. For example, in FIG. 6B, region 624 is not exposed and there a space is formed between the edges of IC die 102 and encapsulant material 110.

FIG. 6C is a cross sectional view illustrating further partial formation of encapsulation material 110 around IC die 102. Additional layers of liquid encapsulation material 110 have been exposed and converted to a solid. Selective exposure of the liquid resin allows lattice 123 to be formed with spaces 122, as described with regard to FIG. 1.

The leadframe strip may be submerged in different vats at different times in order to allow different materials to be formed within the spaces 122 within lattice 123.

Additional layers of resin may be exposed and hardened to form the final stress directing encapsulation structure illustrated in FIG. 1. The leadframe strip may then be sawed or otherwise separated into individual encapsulated IC packages.

In another embodiment, other additive manufacturing processes may be used to form encapsulation material 110. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce a stress directing encapsulation structure as described herein. However, bond wires 106 may require extra care to avoid disrupting the droplet streams.

Figure 7A:
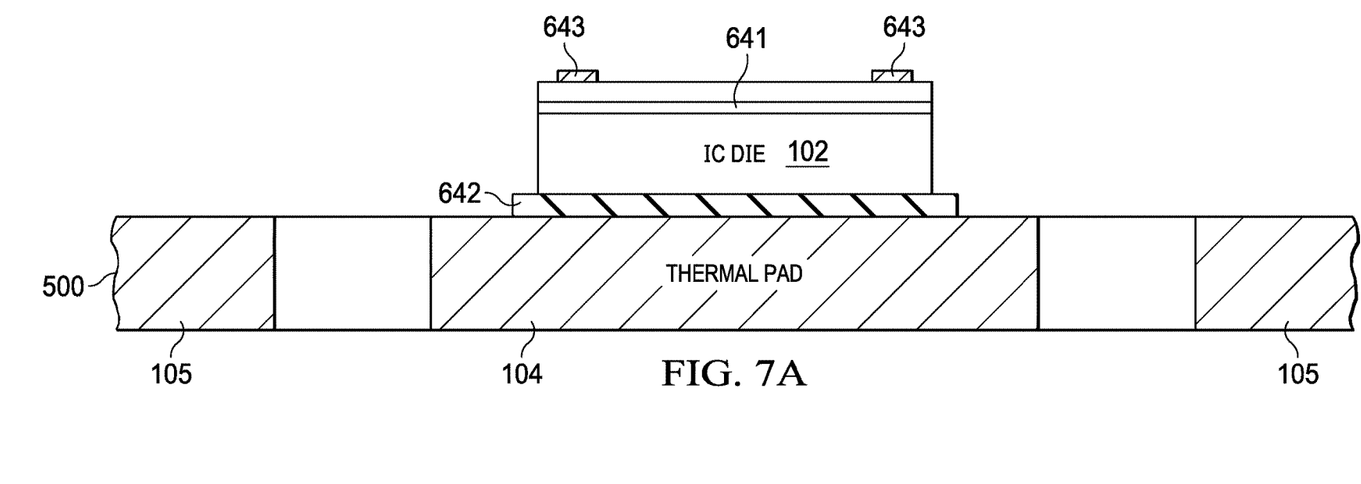
Figure 7B:
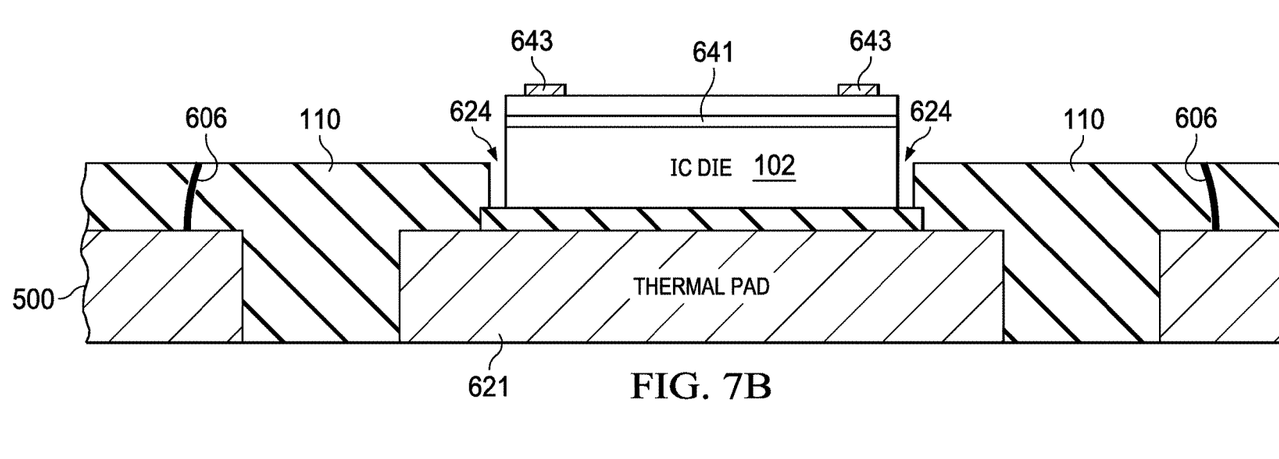
Figure 7C:
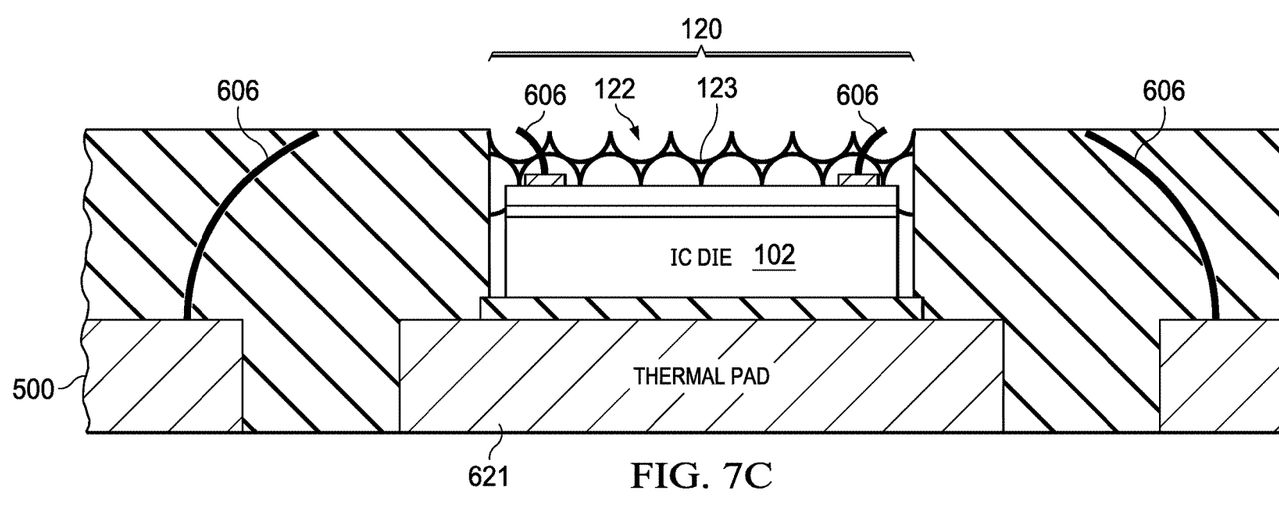

FIGS. 7A-7C are cross sectional views illustrating another fabrication option for the example IC package 100 of FIG. 1. As described above, IC die 102 may be attached by die attach layer 642 to a thermal pad 104 of a leadframe that may be part of a leadframe strip similar to leadframe strip 500 shown in FIG. 5 that includes a set of contacts 105. IC die 102 may be fabricated using known or later developed semiconductor processing techniques. IC die 102 may include an epitaxial (epi) layer 641 on the top surface in which are formed various semiconductor transistor devices and interconnects. One or more conductive layers may be formed on the epi layer and patterned into interconnect traces and bond pads 643. In this example, IC package 100 is a quad-flat no-leads (QFN) package; however, in other embodiments various known or later developed packaging configurations, such as DFN, MLF, SON, dual inline packages (DIP), etc., may be fabricated using the techniques disclosed herein to form an encapsulated package with stress directing material included with the encapsulant material.

In this example, bond wires are not initially bonded to contacts 105 and bond pads 643.

FIG. 7B is a cross sectional view illustrating partial formation of encapsulation material 110. In this example, a material jetting process may be used in which droplets of material are deposited layer by layer to produce a stress directing encapsulation structure as described herein. In this manner, layers of encapsulant material 110 may be formed in selected shapes. In FIG. 6B, region 624 is a space that is formed between the edges of IC die 102 and encapsulant material 110.

As part of the material jetting process, a conductive material may be deposited to form the bond wires between contacts 105 and bond pads 643. A partially formed bond wire is illustrated at 606.

FIG. 7C is a cross sectional view illustrating further partial formation of encapsulation material 110 around IC die 102. Additional layers of material jetting allows lattice 123 to be formed with spaces 122, as described with regard to FIG. 1.

Additional layers of resin may be jet deposited to form the final stress directing encapsulation structure illustrated in FIG. 1. In some embodiments, a sintering process may be done by heating the encapsulated leadframe 500 assembly to further solidify bond wires 606.

The leadframe strip 500 may then be sawed or otherwise separated into individual encapsulated IC packages.

Figure 8A:
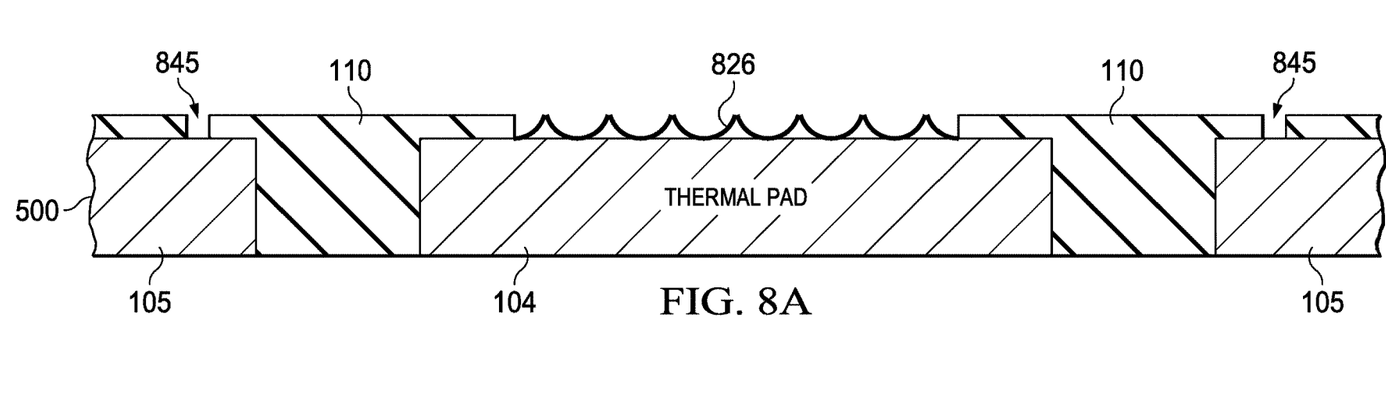
Figure 8B:
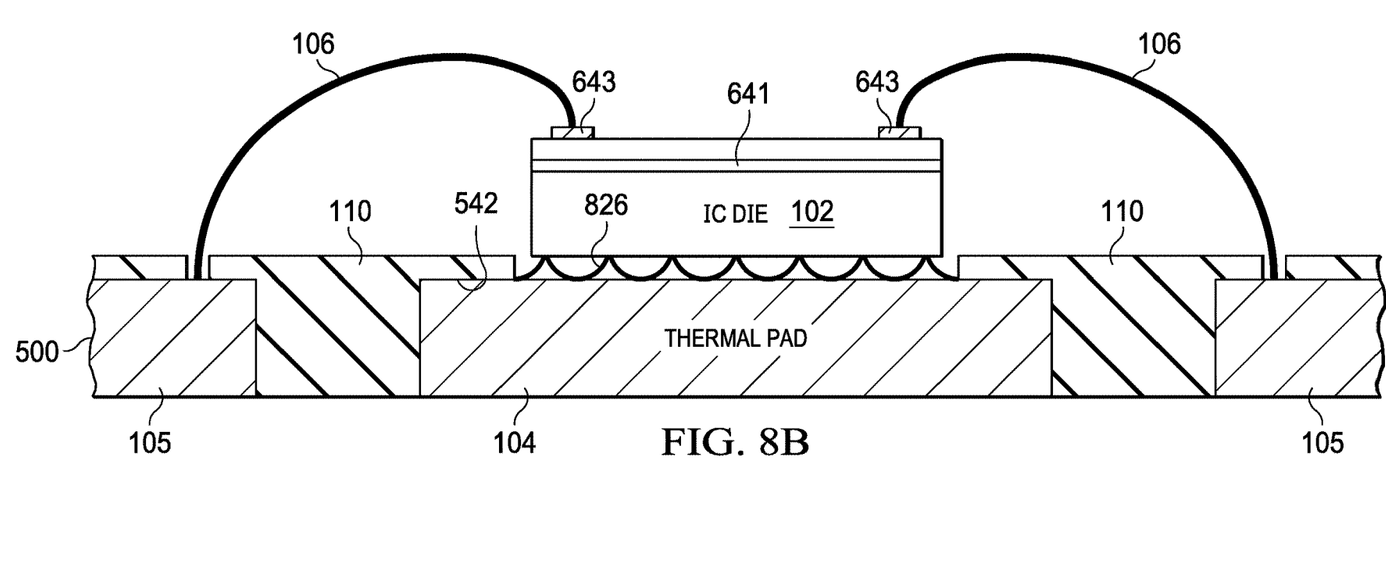
Figure 8C:
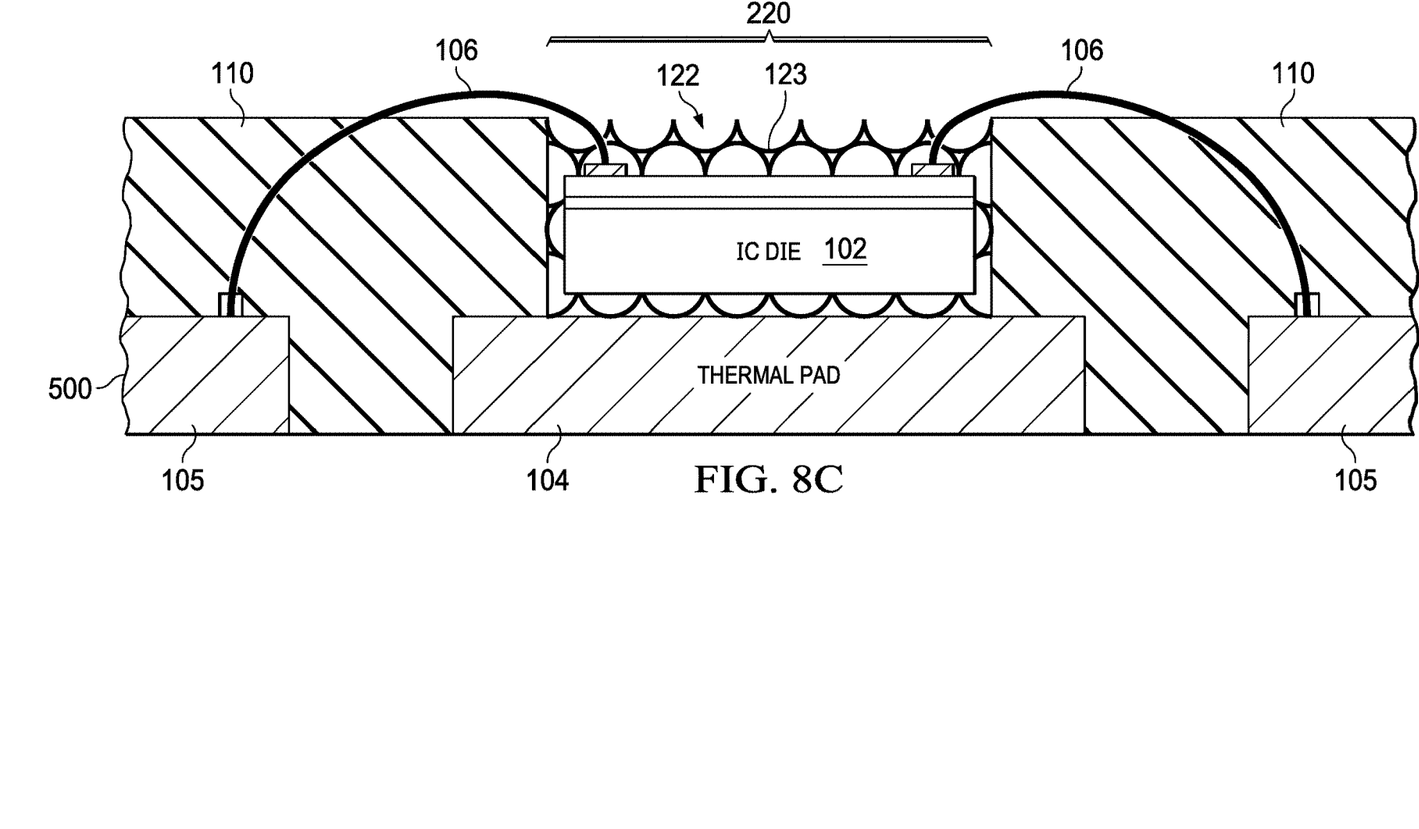

FIGS. 8A-8C are cross sectional views illustrating fabrication of the example IC package 200 of FIG. 2. Initially, IC die 102 is not attached to a thermal pad 104 of a leadframe that may be part of a leadframe strip similar to leadframe strip 500 shown in FIG. 5 that includes a set of contacts 105. In this example, IC package 200 is a quad-flat no-leads (QFN) package; however, in other embodiments various known or later developed packaging configurations, such as DFN, MLF, SON, dual inline packages (DIP), etc, may be fabricated using the techniques disclosed herein to form an encapsulated package with stress directing material included with the encapsulant material.

In this example, a vat photopolymerization process may be used in which leadframe strip is lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. In this manner, a stress directing layer 826 may be fabricated on top of thermal pad 104 to isolate a later attached IC die from thermal pad 104. Spaces may be left above each contact 105 for later attachment of bond wires.

FIG. 8B is a cross sectional view illustrating further partial formation of encapsulation material 110. IC die may be attached to stress directing layer 826 above thermal pad 104. IC die 102 may be fabricated using known or later developed semiconductor processing techniques. IC die 102 may include an epitaxial (epi) layer 641 on the top surface in which are formed various semiconductor transistor devices and interconnects. One or more conductive layers may be formed on the epi layer and patterned into interconnect traces and bond pads 643. A set of bond wires 106 may be attached to contacts 105 and bond pads 643 located on the surface of IC die 106 using known or later developed wire bonding techniques.

FIG. 8C is a cross sectional view illustrating further partial formation of encapsulation material 110 around IC die 102. Additional layers of liquid encapsulation material 110 have been exposed and converted to a solid. Selective exposure of the liquid resin allows lattice 123 to be formed with spaces 122, as described with regard to FIG. 2.

Additional layers of resin may be exposed and hardened to form the final stress directing encapsulation structure illustrated in FIG. 2. The leadframe strip may be submerged in different vats at different times in order to allow different materials to be formed within the spaces 122 within lattice 123. The leadframe strip may then be sawed or otherwise separated into individual encapsulated IC packages.

In another embodiment, other additive manufacturing processes may be used to form encapsulation material 110. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce a stress directing encapsulation structure as described herein. However, bond wires 106 may require extra care to avoid disrupting the droplet streams.

Figure 9A:
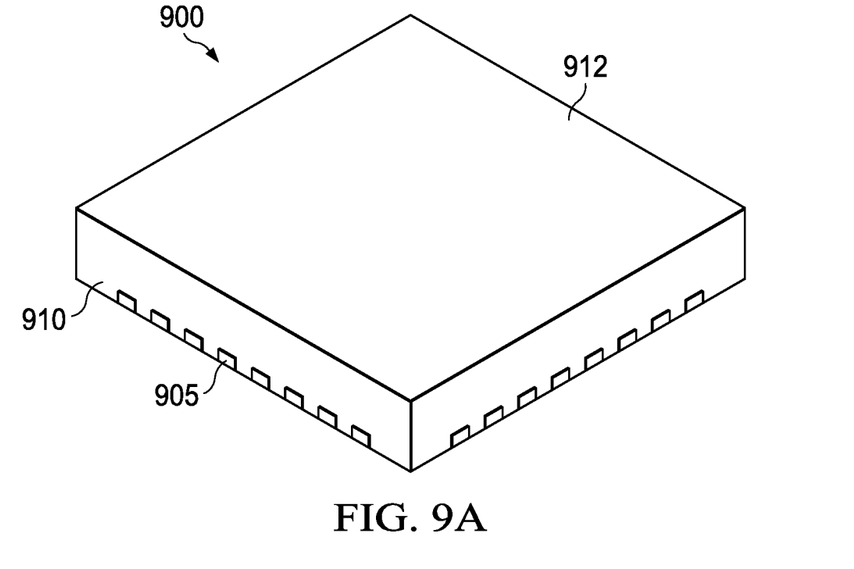
FIG. 9A-9B are top and bottom views of an example IC package that includes a stress directing structure within the encapsulant material.
Figure 9B:
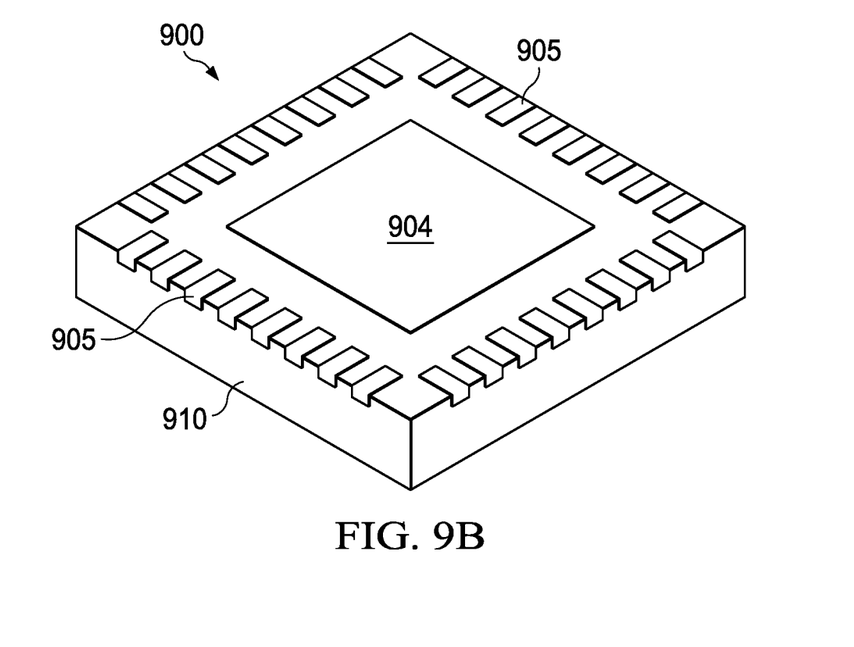

FIG. 9A-9B are top and bottom views of an example IC package 900 that includes a stress directing structure within the encapsulant material as described herein. IC 900 is an illustration of a quad-flat no-leads (QFN) IC package that was encapsulated using additive manufacturing process to form stress directing structures within the encapsulation material as described herein. FIG. 9A illustrates a top side and FIG. 9B illustrates a bottom side of QFN package 900. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad 904 to improve heat transfer out of the IC (into the PCB). Heat transfer can be further facilitated by metal vias in the thermal pad. The QFN package is similar to the quad-flat package, and a ball grid array.

QFN package 900 includes a set of contacts 905 arrayed around the perimeter of the package on the bottom side. Thermal pad 904 has an exposed surface on the bottom side of QFN 900. An integrated circuit die (not shown) is mounted to the other side of thermal pad 904. The entire assembly is encapsulated in an encapsulation material 910 using an additive manufacturing process as described herein to form a stress directing structure. While a QFN is illustrated in FIGS. 9A-9B, other embodiments may use other types of integrated circuit packages.

In some embodiments, a portion of the outside surface of the encapsulated package, such as indicated at 912, may respond to outside stimuli, such as motion, pressure, acoustic, etc. and transfer that stimuli to a sensing circuit on the underlying IC die using a structure such as point contact 428 in FIG. 4 or multiple contacts 327 in FIG. 3, for example.

Figure 10:
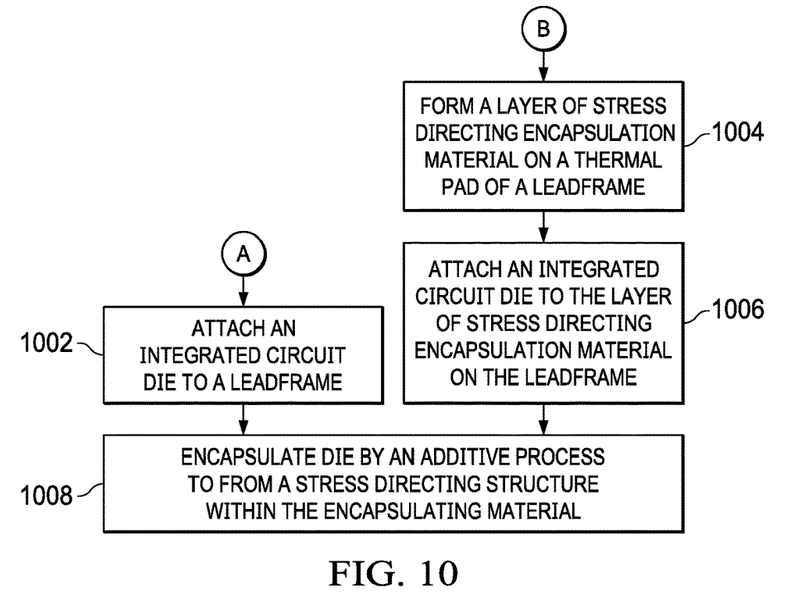
FIG. 10 is a flow diagram illustrating fabrication of the example ICs of FIGS. 1-4.

FIG. 10 is a flow diagram illustrating fabrication of the example ICs of FIGS. 1-4. In one embodiment, as described above in more detail, an IC die may be attached to a thermal pad of a leadframe that includes a set of contacts as indicated at box 1002. The IC die may be fabricated using known or later developed semiconductor processing techniques. The IC die may include an epitaxial (epi) layer on the top surface in which are formed various semiconductor transistor devices and interconnects. One or more conductive layers may be formed on the epi layer and patterned into interconnect traces and bond pads. A set of bond wires may be attached to the contacts and bond pads located on the surface of the IC die using known or later developed wire bonding techniques.

In another embodiment, a layer of stress directing encapsulation material may be first formed on the thermal pad of the leadframe, as indicated at 1004. The encapsulation material may be formed into a lattice with spaces that are filled with a different type of material. For example, certain spaces within the layer of stress directing material may be filled with a material the easily conducts heat from an IC to the thermal pad while other spaces within the stress directing material may be filled with thermal insulating material. As described above in more detail, an additive manufacturing process may be used to create the lattice and fill the spaces in the lattice.

An IC die may then be attached to the layer of stress directing encapsulation material, as indicated at 1006.

The IC die may then be completely encapsulated by an additive process to form a stress directing structure within the encapsulation material as indicated at 1008. A first portion of the encapsulation material may be solid and a second portion of the encapsulation material may include spaces filled with a second material. As described above in more detail, an additive manufacturing process may be used to create a lattice or other type of stress directing structure and fill the spaces in the lattice with a different type of material.

As discussed above in more detail, various types of IC packages may be formed in this manner. For example, a quad-flat no-leads (QFN) package is illustrated in FIGS. 1-4. However, in other embodiments various known or later developed packaging configurations, such as DFN, MLF, SON, dual inline packages (DIP), etc, may be fabricated using the techniques disclosed herein to form an encapsulated package with stress directing material included with the encapsulant material.

Other Embodiments

While the disclosure has been described with reference to illustrative embodiments, this description is not intended to be construed in a limiting sense. Various other embodiments of the disclosure will be apparent to persons skilled in the art upon reference to this description. For example, while a QFN package was illustrated herein, other embodiments may include various known or later developed packaging configurations, such as DFN, MLF, SON, dual inline packages (DIP), etc, that may be fabricated using the techniques disclosed herein to form an encapsulated package with stress directing material included with the encapsulant material.

Figure 11:
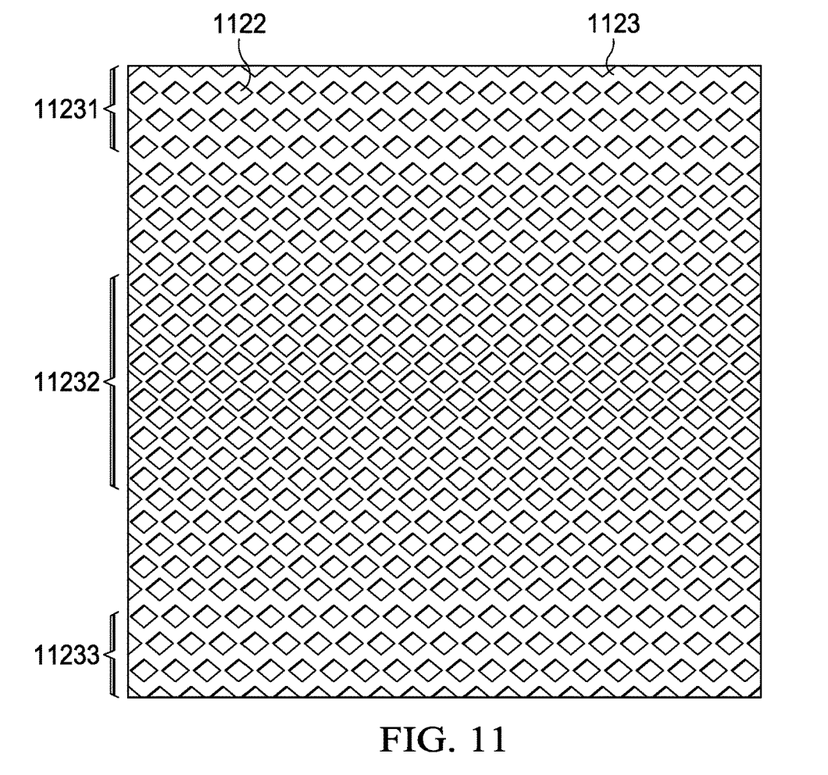
FIG. 11 is an example of a non-homogeneous lattice structure.

FIG. 11 is an example of a non-homogeneous lattice structure 1123 that may be tailored for stress in any arbitrary package. In this example, a portion 11231 has a thicker lattice wall size than another portion 11232 that has a thinner lattice wall size. Similarly, portion 11233 has a relatively thicker lattice wall size than portion 11232. In another embodiment, the spaces 1122 may vary in size or shape across the extent of the lattice structure, for example. Various configurations of a non-homogenous lattice may be used in the examples of FIGS. 1-4, for example, in order to tailor how stress is blocked or directed in the examples shown therein.

In the examples illustrated herein, lattice 123 forms an array of spherical bubbles. In other embodiments, a differently shaped lattice may be formed to produce other shapes of spaces, such as: triangular, square, hexagonal, round bubbles, elongated bubbles, tubes, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A device comprising:
an integrated circuit (IC) die;
a thermal pad;
an encapsulation material encapsulating the IC die, the encapsulation material including a solid material and a layer of material having spaces, the layer of material overlying the thermal pad, and the IC die attached to the layer of material;
a thermally conductive material filling first portions of the spaces; and
a thermally insulative material filling second portions of the spaces.

2. The device of claim 1, wherein the thermally conductive material or the thermally insulative material is a gas or a vacuum.

3. The device of claim 1, wherein the layer of material contacts a first region of the IC die and does not contact a second region of the IC die.

4. The device of claim 1, wherein the thermally conductive material or the thermally insulative material includes N different types of material.

5. The device of claim 1, wherein the spaces include a lattice of interconnected spaces.

6. The device of claim 1, wherein at least some of the spaces are spherical.

7. The device of claim 1, wherein at least some of the spaces are non-spherical.

8. The device of claim 1, wherein the IC die includes a circuit component, and the layer of material is a stress directing structure having an apex coupled to the circuit component.

9. The device of claim 1, wherein the IC die has opposite first and second sides, the first side is attached to the layer of material, and the second side is attached to the thermal pad.

10. A method comprising:
attaching an integrated circuit (IC) die to a leadframe;
encapsulating the IC die by an additive process to form an encapsulation material, the encapsulation material including a solid material and a stress directing structure having spaces, the stress directing structure overlying a thermal pad;
attaching the IC die to the stress directing structure;
filling first portions of the spaces with a thermally conductive material; and
filling second portions of the spaces with a thermally insulative material.

11. The method of claim 10, wherein the IC die has first and second regions, and the method further comprises shaping the stress directing structure to contact the first region and not to contact the second region.

12. The method of claim 10, wherein the thermally conductive material or the thermally insulative material includes N different types of material.

13. The method of claim 10, wherein the spaces include a lattice of interconnected spaces.

14. The method of claim 10, wherein the IC die includes a circuit component, and the stress directing structure has an apex coupled to the circuit component.

15. The method of claim 10, wherein the stress directing structure includes a layer of material on the leadframe, and the method comprises attaching the IC die to the layer of material.

16. A device comprising:
- an integrated circuit (IC) die;
- a thermal pad;
- an encapsulation material encapsulating the IC die, the encapsulation material including a solid material and a lattice material having a lattice of interconnected spaces, at least a portion of the lattice material positioned between the thermal pad and the IC die;
- a thermally conductive material filling first portions of the spaces; and
- a thermally insulative material filling second portions of the spaces.

\* \* \* \* \*